United States Patent
Li et al.

(10) Patent No.: US 11,010,244 B2
(45) Date of Patent: May 18, 2021

(54) MEMORY DATA MANAGEMENT METHOD

(71) Applicant: MACRONIX INTERNATIONAL CO., LTD., Hsinchu (TW)

(72) Inventors: Yung-Chun Li, New Taipei (TW); Ping-Hsien Lin, Taipei (TW); Kun-Chi Chiang, Chiayi County (TW); Chien-Chung Ho, Chiayi County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/571,260

(22) Filed: Sep. 16, 2019

(65) Prior Publication Data

US 2021/0081274 A1    Mar. 18, 2021

(51) Int. Cl.
| | |
|---|---|
| *G06F 11/00* | (2006.01) |
| *G06F 11/30* | (2006.01) |
| *G08C 25/00* | (2006.01) |
| *H03M 13/00* | (2006.01) |
| *H04L 1/00* | (2006.01) |
| *G06F 11/10* | (2006.01) |
| *G06F 11/07* | (2006.01) |
| *G11C 11/4074* | (2006.01) |
| *G11C 11/409* | (2006.01) |

(52) U.S. Cl.
CPC ........ *G06F 11/1068* (2013.01); *G06F 11/076* (2013.01); *G06F 11/3037* (2013.01); *G11C 11/409* (2013.01); *G11C 11/4074* (2013.01)

(58) Field of Classification Search
CPC ............... G06F 11/1068; G06F 11/076; G06F 11/4074; G06F 11/409; G06F 11/3037
See application file for complete search history.

(56) References Cited

U.S. PATENT DOCUMENTS

| | | | |
|---|---|---|---|
| 9,627,085 B2 | 4/2017 | Yang | |
| 2010/0232226 A1* | 9/2010 | Kim | G11C 16/3495 365/185.19 |
| 2014/0355340 A1* | 12/2014 | Sharon | G11C 29/04 365/185.03 |
| 2019/0004734 A1* | 1/2019 | Kirshenbaum | G06F 3/0659 |
| 2019/0012227 A1* | 1/2019 | Kim | H03M 13/1585 |

FOREIGN PATENT DOCUMENTS

TW    201421476 A    6/2014

* cited by examiner

*Primary Examiner* — Samir W Rizk
(74) *Attorney, Agent, or Firm* — McClure, Qualey & Rodack, LLP

(57) ABSTRACT

A memory data management method includes the following steps reading a plurality of data of a plurality of memory cells of a memory block; determining whether error bits of the data exceed an error correction code (ECC) threshold; if the error bits of the data exceed the ECC threshold, a programming process being executed to increase a first threshold voltage of a first state data of the data for exceeding a first threshold, to increase a second threshold voltage of a second state data of the data for exceeding a second threshold, and to increase a third threshold voltage of a third state data of the data for exceeding a third threshold.

10 Claims, 4 Drawing Sheets

MEMORY DATA MANAGEMENT METHOD

BACKGROUND OF THE INVENTION

Field of Invention

The present invention relates to a data management method. More particularly, the present invention relates to a memory data management method.

Description of Related Art

Conventional memory data management method is that data will be corrected and stored in a new memory block when error bits of data exceed a threshold. When data is moved to a new memory block, data need to be stored in a cache and then data will be written in the new memory block. Since the writing process is a new programming process, executing such writing process wastes lots of time and system performance is therefore decreased.

In view of the foregoing, problems and disadvantages are associated with existing products that require further improvement. However, those skilled in the art have yet to find a solution.

SUMMARY OF THE INVENTION

The following presents a simplified summary of the disclosure in order to provide a basic understanding to the reader. This summary is not an extensive overview of the disclosure and it does not identify key/critical elements of the present invention or delineate the scope of the present invention.

One aspect of the present disclosure is directed to a memory data management method. The memory data management method comprises the following steps: reading a plurality of data of a plurality of memory cells of a memory block; determining whether error bits of the data exceed an error correction code (ECC) threshold; if the error bits of the data exceed the ECC threshold, a programming process being executed to increase a first threshold voltage of a first state data of the data for exceeding a first threshold, to increase a second threshold voltage of a second state data of the data for exceeding a second threshold, and to increase a third threshold voltage of a third state data of the data for exceeding a third threshold.

In view of the foregoing, embodiments of the present disclosure provide a memory data management method. A fast adjusting mode of the present disclosure is executed so as to improve a retention error rate. A reliable adjusting mode of the present disclosure is executed so as to enhance its retention ability.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

Figure 1:
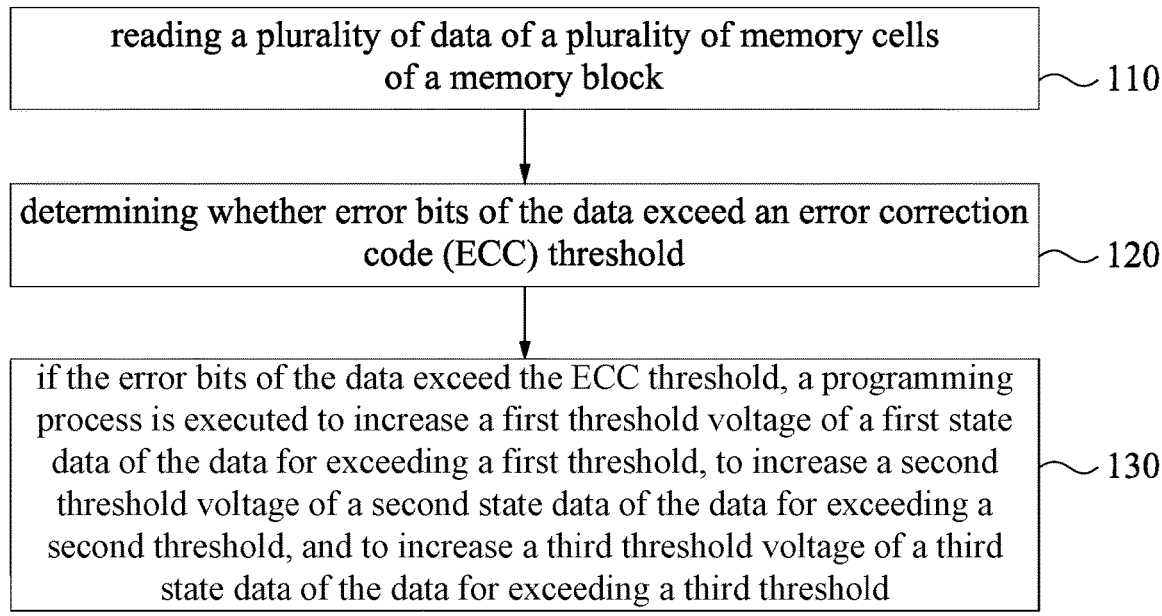
FIG. 1 is a flow diagram of a memory data management method according to some embodiments of the present disclosure.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

FIG. 1 is a flow diagram of a memory data management method according to some embodiments of the present disclosure. As shown in the figure, the memory data management method includes the following steps:

Step 110: reading a plurality of data of a plurality of memory cells of a memory block;

Step 120: determining whether error bits of the data exceed an error correction code (ECC) threshold, wherein the ECC can be assumed to correct X bits errors, the ECC threshold is Y bits, and Y is less than X;

Step 130: if the error bits of the data exceed the ECC threshold, a programming process being executed to increase a first threshold voltage of a first state data of the data for exceeding a first threshold, to increase a second threshold voltage of a second state data of the data for exceeding a second threshold, and to increase a third threshold voltage of a third state data of the data for exceeding a third threshold.

In step 110, when retention errors in the memory occur, a refresh process is executed to pick up a memory block and read a plurality of data of a plurality of memory cells in the memory block. In step 120, a process is executed to determine whether the error bits of the data exceed the ECC threshold. In step 130, if the error bits of the data exceed the ECC threshold, a programming process is executed to increase a first threshold voltage of a first state data of the data for exceeding a first threshold, to increase a second threshold voltage of a second state data of the data for exceeding a second threshold, and to increase a third threshold voltage of a third state data of the data for exceeding a third threshold.

Figure 2:
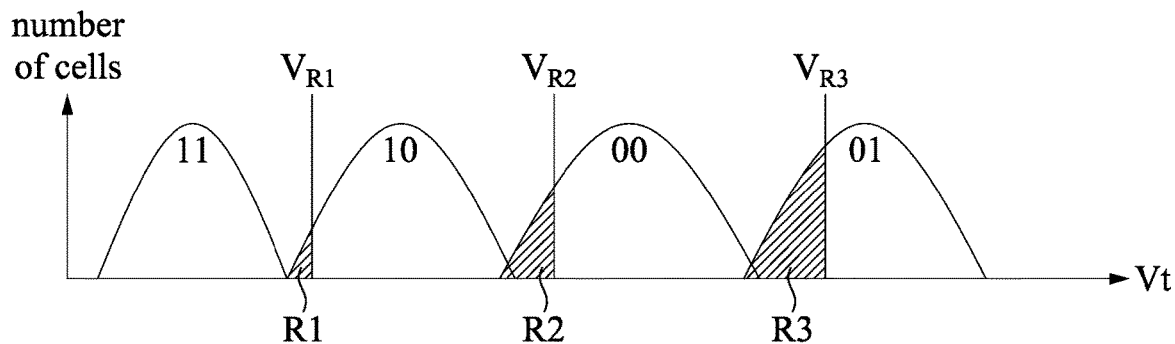
FIG. 2 is a schematic diagram of a voltage operation for managing a memory data method according to some embodiments of the present disclosure.
Figure 2:
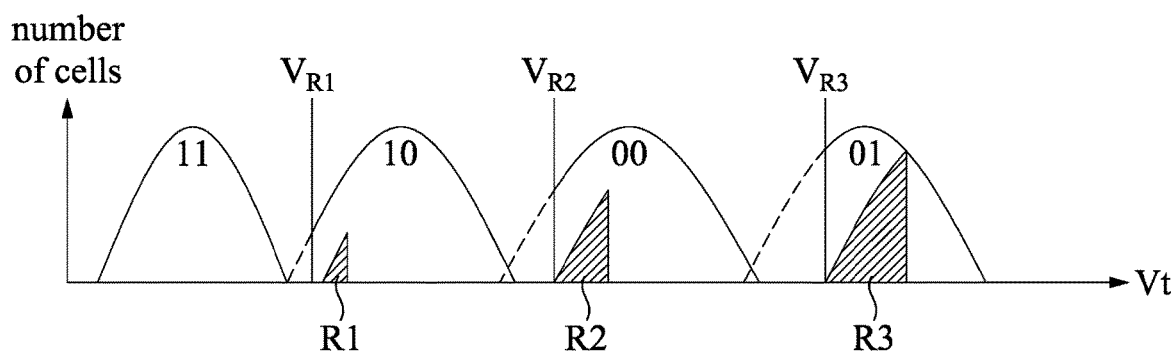

For example, reference is now made to FIG. 2, which is a schematic diagram of a voltage operation for managing a memory data method according to some embodiments of the present disclosure. The memory cells in the present disclosure can be multi-Level cells (MLC), and each of the memory cells includes two storing bits for storing data. Therefore, each of the memory cells includes a logic state 11, a logic state 10, a logic state 00, and a logic state 01. When retention errors in the memory occur, a refresh process is executed to pick up a memory block and read a plurality of data of a plurality of memory cells in the memory block. A process is executed to determine whether the error bits of the data exceed the ECC threshold. If it is, a portion of the logic state data 10 that exceeds the threshold $V_{R1}$ and a first predetermined state data are compared so as to obtain an error state data R1. The first predetermined state data is a correct voltage distribution data of the memory cell which is obtained by ECC technology. As can be seen in the figure, the logic state data 10 has the error state data R1 which does not exceed the threshold $V_{R1}$. Hence, the error state data R1 can be obtained after the portion of the first state data 10 that exceeds the threshold $V_{R1}$ and a predetermined state data are compared. At the same time, a one shot programming process can be executed to increase the error state data R1 (i.e., a corresponding bias is selected to increase the error state data R1), such that the error state data R1 exceeds the threshold $V_{R1}$.

Similarly, a portion of the logic state data 00 that exceeds the threshold $V_{R2}$ and a second predetermined state data are compared so as to obtain an error state data R2. The second predetermined state data is a correct voltage distribution data of the memory cell which is obtained by ECC technology. As can be seen in the figure, the logic state data 00 has the error state data R2 which does not exceed the threshold $V_{R2}$. Hence, the error state data R2 can be obtained after the portion of the logic state data 00 that exceeds the threshold $V_{R2}$ and a predetermined state data are compared. At the same time, a one shot programming process can be executed to increase the error state data R2 (i.e., a corresponding bias is selected to increase the error state data R2), such that the error state data R2 exceeds the threshold $V_{R2}$.

Furthermore, a portion of the logic state data 01 that exceeds the threshold $V_{R3}$ and a third predetermined state data are compared so as to obtain an error state data R3. The third predetermined state data is a correct voltage distribution data of the memory cell which is obtained by ECC technology. As can be seen in the figure, the logic state data 01 has the error state data R3 which does not exceed the threshold $V_{R3}$. Hence, the error state data R3 can be obtained after the portion of the logic state data 01 that exceeds the threshold $V_{R3}$ and a predetermined state data are compared. At the same time, a one shot programming process can be executed to increase the error state data R3 (i.e., a corresponding bias is selected to increase the error state data R3), such that the error state data R3 exceeds the threshold $V_{R3}$. The above-mentioned embodiment discloses a fast adjusting mode of the present disclosure. The fast adjusting mode of the present disclosure may adopt the one shot programming manner to merely increase the error state data, such that the error state data can be increased for exceeding a corresponding threshold fast so as to improve the retention error rate.

In some embodiments, increasing the error state data R1 by a corresponding bias, increasing the error state data R2 by a corresponding and increasing the error state data R3 by a corresponding are executed at the same time.

Figure 3:
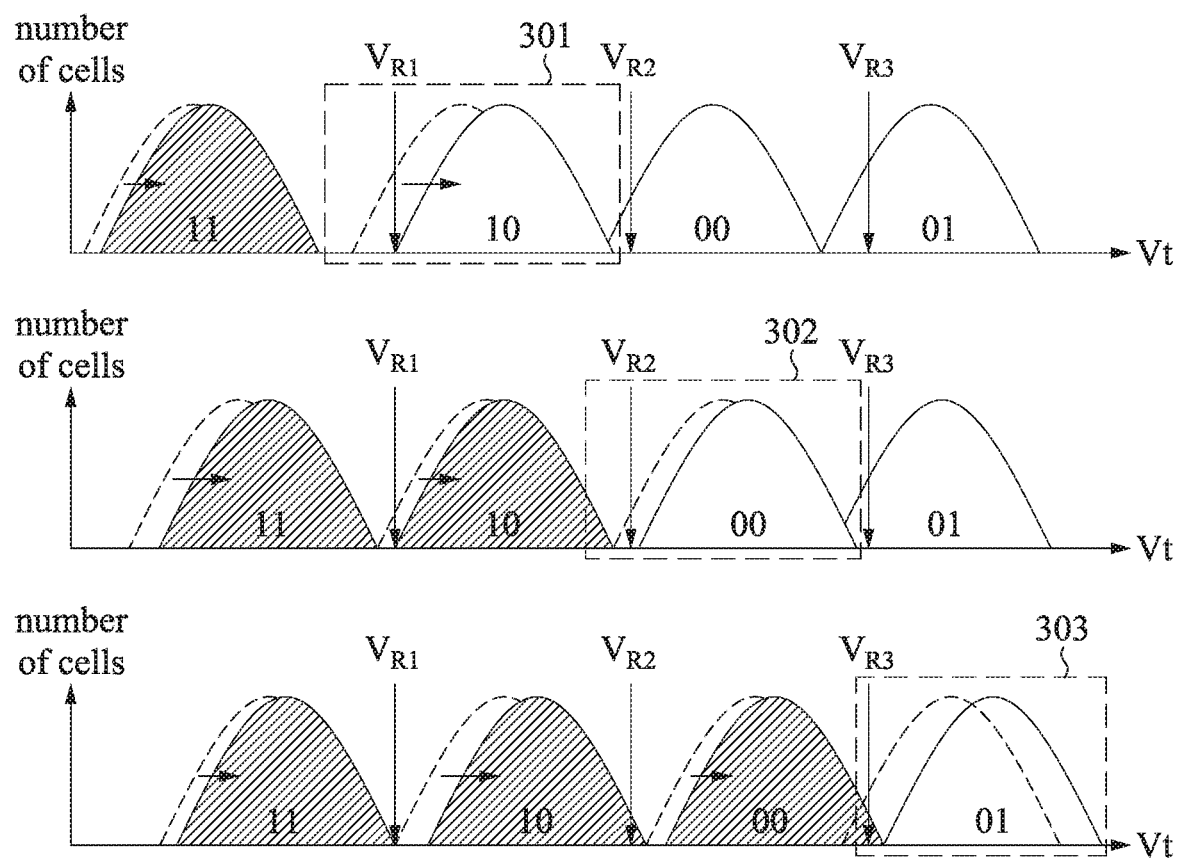
FIG. 3 is a schematic diagram of a voltage operation for managing a memory data method according to some embodiments of the present disclosure.

FIG. 3 is a schematic diagram of a voltage operation for managing a memory data method according to some embodiments of the present disclosure. When retention errors in the memory occur, a refresh process is executed to pick up a memory block and read data of memory cells in the memory block. A process is executed to determine whether the error bits of the data exceed the ECC threshold. If it is, referring to label 301, a bias is selected to increase the logic state data 10, such that the logic state data 10 exceeds the threshold $V_{R1}$. In some embodiments, the bias may include a plurality of one shot programming manners in a particular voltage range.

Similarly, referring to label 302, a bias is selected to increase the logic state data 00, such that the logic state data 00 exceeds the threshold $V_{R2}$. In addition, referring to label 303, a bias is selected to increase the logic state data 01, such that the logic state data 01 exceeds the threshold $V_{R3}$. The above-mentioned embodiment discloses a reliable adjusting mode of the present disclosure. The reliable adjusting mode of the present disclosure may adopt a bias to increase the logic state data entirely, such that the logic state data exceeds a corresponding threshold so as to enhance its retention ability.

Figure 4:
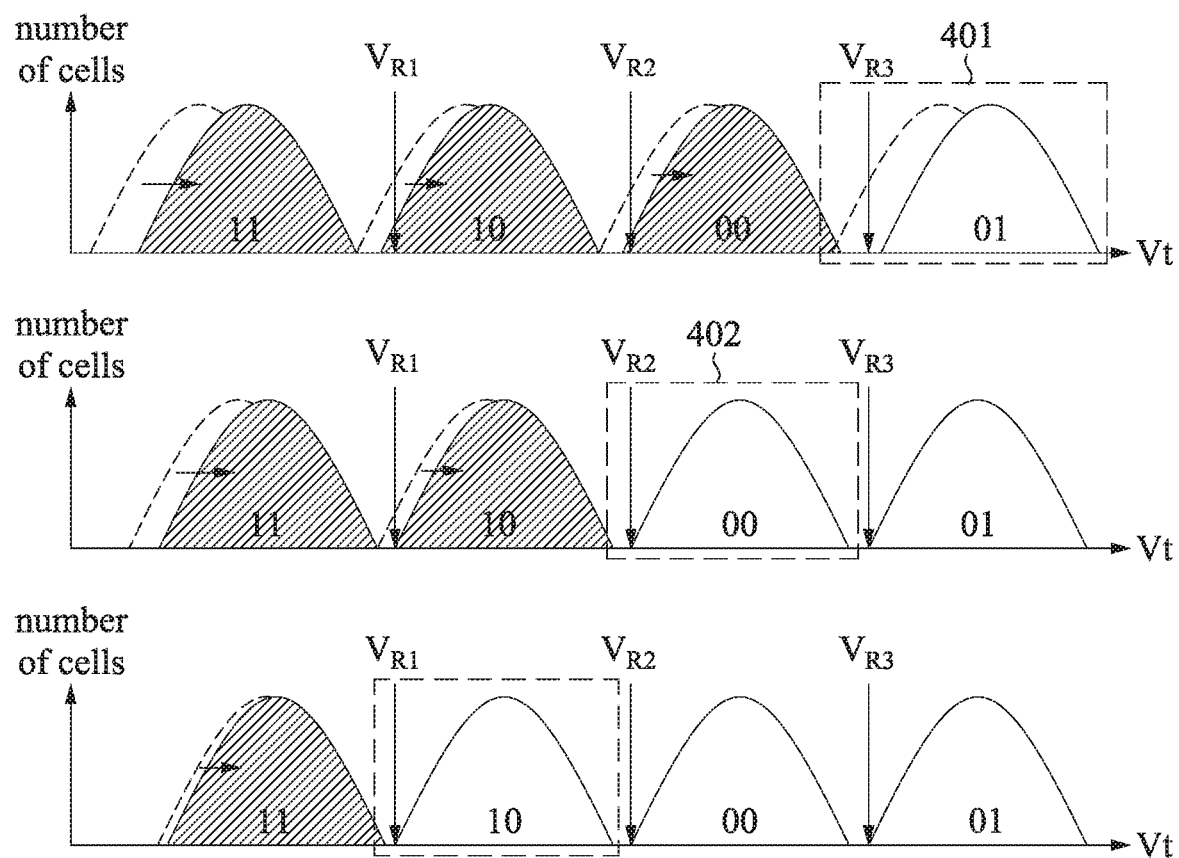
FIG. 4 is a schematic diagram of a voltage operation for managing a memory data method according to some embodiments of the present disclosure.

FIG. 4 is a schematic diagram of a voltage operation for managing a memory data method according to some embodiments of the present disclosure. When retention errors in the memory occur, a refresh process is executed to pick up a memory block and read data of memory cells in the memory block. A process is executed to determine whether the error bits of the data exceed the ECC threshold. If it is, referring to label 301, a bias is selected to increase the logic state data 01, such that the logic state data 01 exceeds the threshold $V_{R3}$. In some embodiments, the bias may include a plurality of one shot programming manners in a particular voltage range.

Similarly, referring to label 402, a bias is selected to increase the logic state data 00, such that the logic state data 00 exceeds the threshold $V_{R2}$. In addition, referring to label 403, a bias is selected to increase the logic state data 10, such that the logic state data 10 exceeds the threshold $V_{R1}$. The above-mentioned embodiment discloses a reliable adjusting mode of the present disclosure. The reliable adjusting mode of the present disclosure may adopt a bias to increase the logic state data entirely, such that the logic state data exceeds a corresponding threshold so as to increase its retention ability.

Besides, in this embodiment, the logic state data 01 is increased first. Since the bias applied to the logic state data 01 is higher, the logic state data 00, 10 will be affected and increased by the bias. In addition, in this embodiment, the logic state data 00 is increased first, too. Since the bias applied to the logic state data 00 is higher, the logic state data 10 will be affected and increased by the bias. In view of the above, when the logic state data 01 is increased, other logic state data will be increased at the same time. Subsequently, when the logic state data 00 is increased, the logic state data 10 will be increased at the same time. As such, the logic state data can be increased for exceeding a corresponding threshold early.

Figure 5:
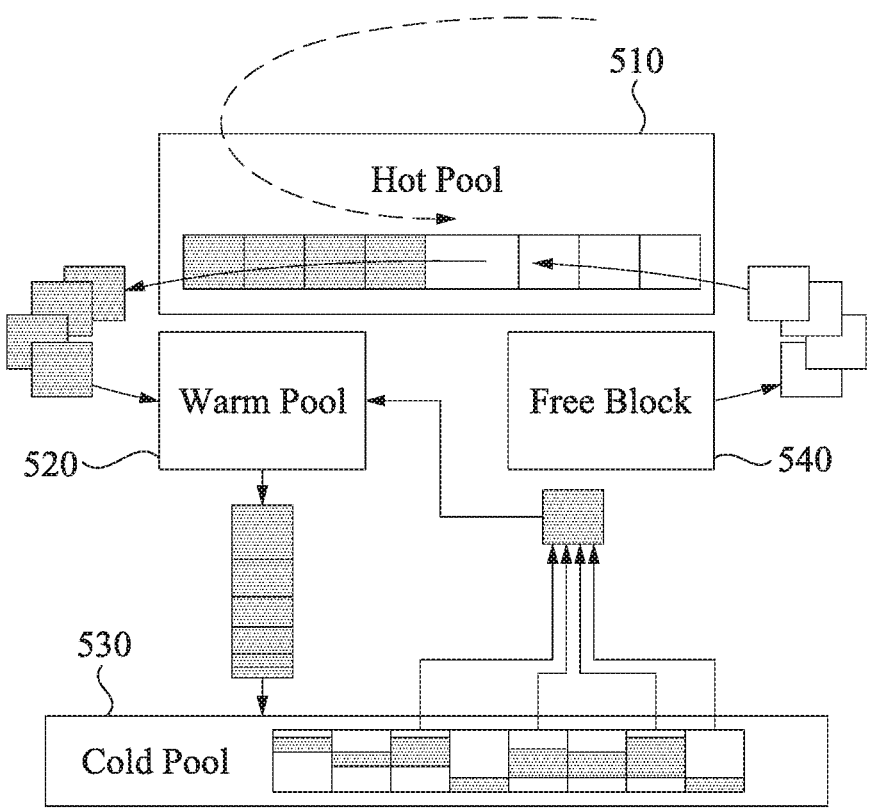
FIG. 5 is an operation diagram of a memory data management method according to some embodiments of the present disclosure.

FIG. 5 is an operation diagram of a memory data management method according to some embodiments of the present disclosure. As shown in the figure, when data are just written into a memory, the data will be stored in the hot pool 510. If the hot pool 510 is full, the data will be transmitted to warm pool 520. When retention errors in the memory occur and a refresh process is executed, data will be transmitted to cold pool 530 if the one shot programming is executed to data for several times as shown in FIG. 2. In addition, in the cold pool 530, when retention errors in the memory occur and the logic state data is increased by a corresponding bias as shown in FIG. 3 and FIG. 4, a garbage collection process is executed, and the collected data will be transmitted to the warm pool 520. Other memory blocks that do not store data can be moved from block 540 to the hot pool 510.

In the above-mentioned embodiment, if data is stored in the warm pool 520, it represents that data need to be observed to understand data characteristic. At this time, one shot programming is executed to data as shown in FIG. 2, such that the error state data are increased for exceeding a corresponding threshold fast so as to improve the retention error rate. In addition, if data is stored in the cold pool 530, the logic state data is increased by a corresponding bias as shown in FIG. 3 and FIG. 4, such that the logic state data exceeds a corresponding threshold so as to enhance its retention ability.

In view of the above embodiments of the present disclosure, it is apparent that the application of the present invention has the advantages as follows. Embodiments of the present disclosure provide a memory data management method. The fast adjusting mode of the present disclosure is executed so as to improve the retention error rate. The reliable adjusting mode of the present disclosure is executed so as to enhance its retention ability.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory data management method, comprising:
   reading a plurality of data of a plurality of memory cells of a memory block;
   determining whether error bits of the data exceed an error correction code threshold; and
   if the error bits of the data exceed the error correction code threshold, a programming process being executed to increase a first threshold voltage of a first state data of the data for exceeding a first threshold, to increase a second threshold voltage of a second state data of the data for exceeding a second threshold, to increase a third threshold voltage of a third state data of the data for exceeding a third threshold.

2. The memory data management method of claim 1, wherein if the error bits of the data exceed the error correction code threshold, the programming process is executed comprises:
   comparing a portion of the first state data that exceeds the first threshold and a first predetermined state data so as to obtain a first error state data; and
   increasing the first error state data by a first bias, such that the first error state data exceeds the first threshold.

3. The memory data management method of claim 2, wherein if the error bits of the data exceed the error correction code threshold, the programming process is executed further comprises:
   comparing a portion of the second state data that exceeds the second threshold and a second predetermined state data so as to obtain a second error state data; and
   increasing the second error state data by a second bias, such that the second error state data exceeds the second threshold.

4. The memory data management method of claim 3, wherein if the error bits of the data exceed the error correction code threshold, the programming process is executed further comprises:
   comparing a portion of the third state data that exceeds the third threshold and a third predetermined state data so as to obtain a third error state data; and
   increasing the third error state data by a third bias, such that the third error state data exceeds the third threshold.

5. The memory data management method of claim 4, wherein increasing the first error state data by the first bias, increasing the second error state data by the second bias and increasing the third error state data by the third bias are executed at the same time.

6. The memory data management method of claim 1, wherein if the error bits of the data exceed the error correction code threshold, the programming process is executed comprises:
   increasing the first threshold voltage of the first state data by a first bias, such that the first state data exceeds the first threshold.

7. The memory data management method of claim 6, wherein if the error bits of the data exceed the error correction code threshold, the programming process is executed further comprises:
   increasing the second threshold voltage of the second state data by a second bias, such that the second state data exceeds the second threshold.

8. The memory data management method of claim 7, wherein if the error bits of the data exceed the error correction code threshold, the programming process is executed further comprises:
   increasing the third threshold voltage of the third state data by a third bias, such that the third state data exceeds the third threshold.

9. The memory data management method of claim 8, wherein the third threshold is larger than the second threshold, and the second threshold is larger than the first threshold, wherein an executing sequence is that increasing the first threshold voltage of the first state data by the first bias, increasing the second threshold voltage of the second state data by the second bias and increasing the third threshold voltage of the third state data by the third bias.

10. The memory data management method of claim 8, wherein the third threshold is larger than the second threshold, and the second threshold is larger than the first threshold, wherein an executing sequence is that increasing the third threshold voltage of the third state data by the third bias, increasing the second threshold voltage of the second state data by the second bias and increasing the first threshold voltage of the first state data by the first bias.

* * * * *